United States Patent
Tian et al.

(10) Patent No.: US 8,421,392 B2
(45) Date of Patent: Apr. 16, 2013

(54) APPARATUS AND METHOD FOR CONTROLLING SPEED OF FAN IN COMPUTER

(75) Inventors: Bo Tian, Shenzhen (CN); Guo-Yi Chen, Shenzhen (CN); Kang Wu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 296 days.

(21) Appl. No.: 13/030,137

(22) Filed: Feb. 18, 2011

(65) Prior Publication Data

US 2012/0081056 A1      Apr. 5, 2012

(30) Foreign Application Priority Data

Sep. 30, 2010    (CN) .......................... 2010 1 0298203

(51) Int. Cl.
*G05D 23/00* (2006.01)
*G05B 11/28* (2006.01)

(52) U.S. Cl.
USPC .......................................... 318/471; 700/300

(58) Field of Classification Search .................. 318/34, 318/268, 272, 599, 811, 471–473; 700/300; 388/934
See application file for complete search history.

(56) References Cited

U.S. PATENT DOCUMENTS

| | | | | |
|---|---|---|---|---|
| 7,222,266 B2 * | 5/2007 | Wu et al. | .......................... | 714/39 |
| 7,849,332 B1 * | 12/2010 | Alben et al. | .................. | 713/300 |
| 8,093,854 B2 * | 1/2012 | Wang | ............................ | 318/599 |
| 2008/0281475 A1 * | 11/2008 | Hirai et al. | ..................... | 700/300 |
| 2011/0119424 A1 * | 5/2011 | Chen et al. | ..................... | 710/305 |
| 2012/0080946 A1 * | 4/2012 | Peng | ............................... | 307/31 |
| 2012/0301321 A1 * | 11/2012 | Wu et al. | ............................ | 417/1 |
| 2012/0308400 A1 * | 12/2012 | Wu et al. | ............................ | 417/1 |

* cited by examiner

*Primary Examiner* — Eduardo Colon Santana
(74) *Attorney, Agent, or Firm* — Altis Law Group, Inc.

(57) ABSTRACT

An apparatus and method controls a speed of a fan in a computer. The apparatus includes a signal generator, a signal buffer, a signal switch, and an integrated baseboard management controller (IBMC). The IBMC includes a general purpose input output (GIPO) pin and a signal output port. The IBMC determines whether the IBMC operates normally by detecting a voltage status of the GIPO pin. The signal generator generates a first pulse width modulation (PWM) signal according to a system temperature of the computer when the IBMC does not operate normally. The IBMC generates a second PWM signal to according to the system temperature of the computer when the IBMC operates normally. The signal switch controls the speed of the fan according to the first PWM signal or the second PWM signal.

12 Claims, 2 Drawing Sheets

APPARATUS AND METHOD FOR CONTROLLING SPEED OF FAN IN COMPUTER

BACKGROUND

1. Technical Field

Embodiments of the present disclosure relate to methods and apparatuses for controlling computing systems, and particularly to apparatus and method for controlling speed of a fan in a computer.

2. Description of Related Art

A fan installed inside a computer housing is used to expend heat inside the computer housing generated by a plurality of elements such as CPU, and hard disk drive, so as to reduce temperature inside the computer housing. But when the fan is operating at a high speed, noise will be generated. Thus, in order to control speed of the fan, at least one temperature sensor is generally installed inside the computer housing to sense the temperature, and regulate the speed of the fan according to the temperature detected by the sensor.

Some computer manufacturers install one or more sensors near or on the CPU, to conveniently measure the temperature of the CPU. However, this just measures the temperature of the CPU that is operating, but ignores the temperature raising due to the heat generated by other components, such as the hard disk drive, and the CD-ROM drive. For example, sometimes the temperature detected from the CPU is very high, but the temperature measured inside the computer housing is not, at this time, if increasing the speed of the fan to dissipate the heat of the computer system does not efficiently reduce the temperature inside the computer housing, and the noise that is generated with the fan operating at high speed will be greatly increased.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
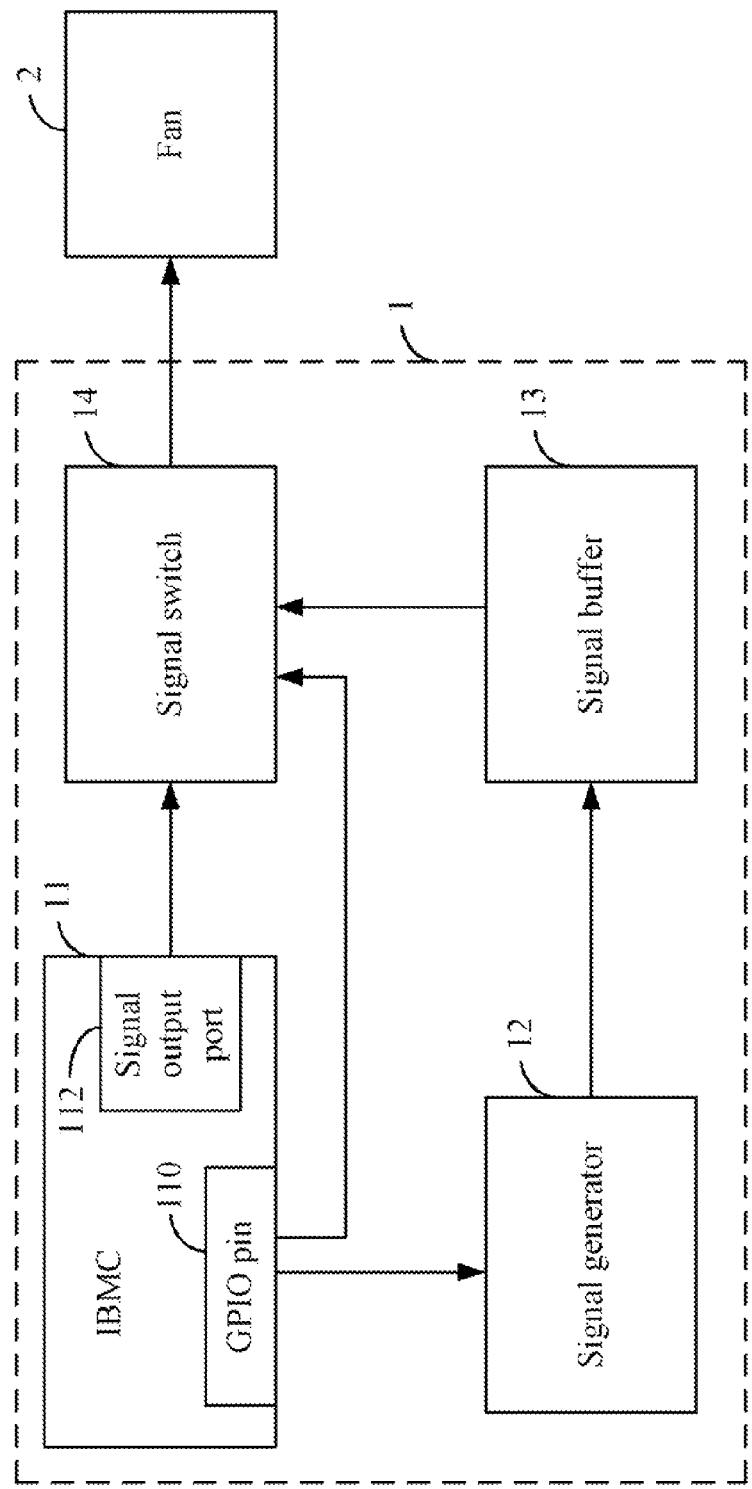
FIG. 1 is a block diagram of one embodiment of a fan speed control apparatus.

FIG. 1 is a block diagram of one embodiment of a fan speed control apparatus 1. In the embodiment, the fan speed control apparatus 1 can automatically control a speed of a fan that is installed in a computer such as personal computer (PC), a notebook, or a server. The fan speed control apparatus 1 include an integrated baseboard management controller (IBMC) 11, a signal generator 12, a signal buffer 13, and a signal switch 14. The IBMC 11 may include a general purpose input output (GPIO) pin 110, and a signal output port 112. The IBMC 11 connects to the signal generator through the GPIO pin 110, and connects to the signal switch 14 through the GPIO pin 110 and the signal output port 112. The signal generator 12 connects to the signal buffer 13 through a first signal line, and the signal buffer 13 connects to the signal switch 14 through a second signal line. The signal switch 14 is electrically connected to the fan 2 of the computer. It should be understood that FIG. 1 illustrates only one example of the apparatus 1, and may include more or fewer components than illustrated, or a different configuration of the various components in other embodiments.

In the embodiment, the signal generator 12 generates a first pulse width modulation (PWM) signal to control the speed of the fan 2 when the IBMC 11 does not operate normally. The IBMC 11 generates a second PWM signal to control the speed of the fan 2 when the IBMC 11 operates normally. The first PWM signal is a pulse signal for decreasing a duty ratio of the speed of the fan 2, for example, the fan 2 rotates at 50% of the full speed. The speed of fan 2 may be decreased when the fan 2 is controlled by the first PWM signal. The second PWM signal is a pulse signal for increasing a duty ratio of the speed of the fan 2, for example, the fan 2 rotates at 100% of the full speed. The speed of fan 2 may be increased when the fan 2 is controlled by the second PWM signal.

The IBMC 11 is configured to detect a voltage status of the GIPO pin 110 to determine whether the IBMC 11 operates normally. In one embodiment, the GIPO pin 110 has a default value that is defined as a low voltage status (e.g., 0 volts is denoted as a digital number "0") when the IBMC 11 does not operate normally. The voltage status of the GIPO pin 110 is changed from the low voltage status to a high voltage status (e.g., 5 volts is denoted as a digital number "1") when the IBMC 11 operates normally.

The IBMC 11 is further configured to generate an enabling signal to enable the signal generator 12 according to the low voltage status of the GPIO pin 110 when the IBMC 11 does not operate normally, and control the signal switch 14 to the signal buffer 13 according to the enabling signal. When the IBMC 11 operates normally, the IBMC 11 generates an disabling signal to disable the signal generator 12 according to the high voltage status of the GPIO pin 110, and control the signal switch 14 to switch to the IBMC 11 according to the disabling signal. In addition, the IBMC 11 generates the second PWM signal according to a system temperature of the computer, and sends the second PWM signal to the signal switch 14 through the signal output port 112. In one embodiment, the system temperature may include the temperature of a CPU, a memory, a hard disk drive, CD-ROM drive or other components of the computer.

The signal generator 12 is configured to generate the first PWM signal according to the system temperature of the computer when the IBMC 11 does not operate normally, and send the first PWM signal to the signal switch 14 through the signal buffer 13. In one embodiment, the signal buffer 13 may be a signal amplifier that is used to amplify the first PWM signal and send the magnified first PWM signal to the signal switch 14.

The signal switch 14 is configured to control the speed of the fan 2 according to the first PWM signal when the IBMC 11 does not operate normally, and control the speed of the fan 2 according to the second PWM signal when the IBMC 11 operates normally.

Figure 2:
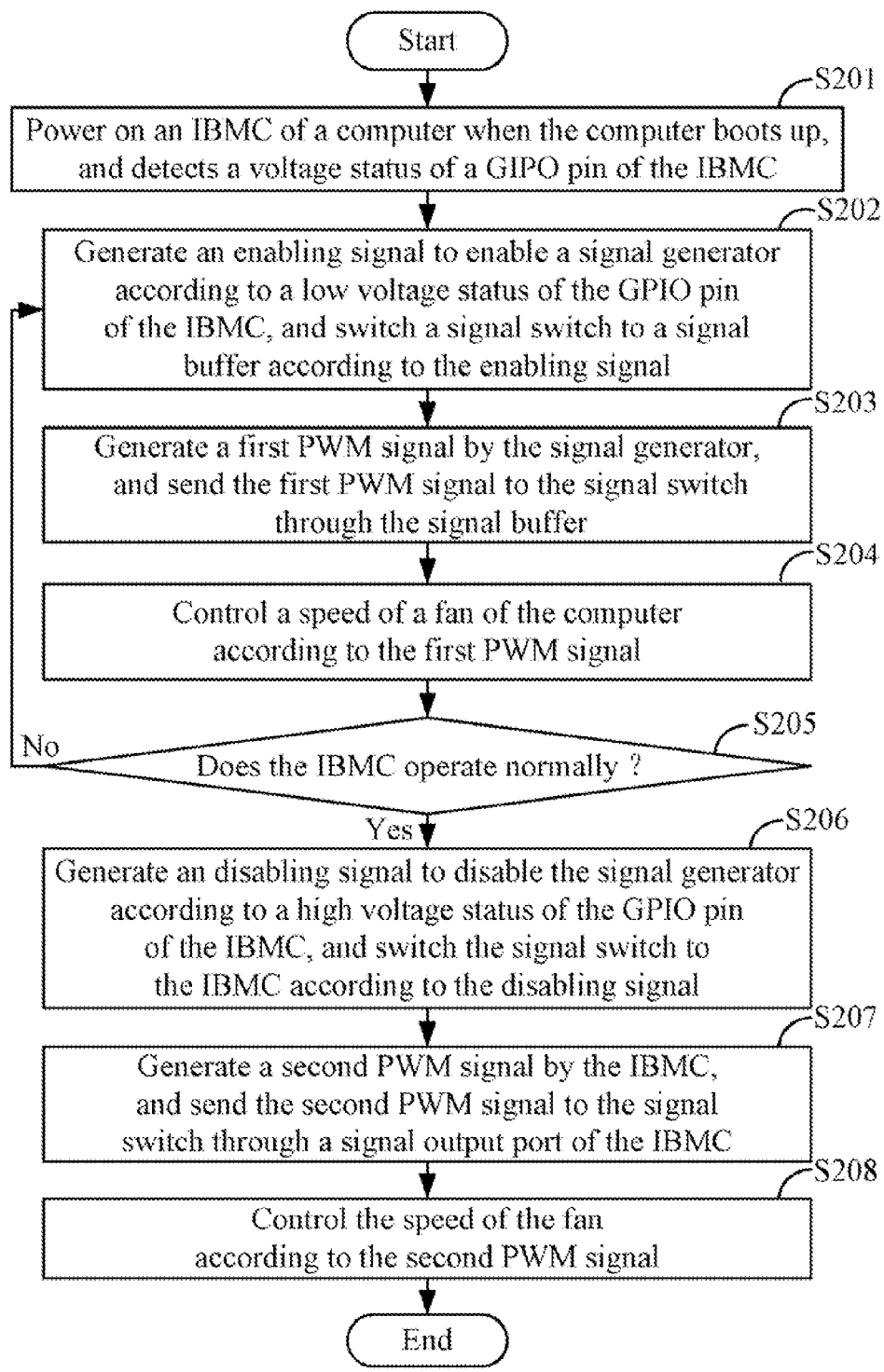
FIG. 2 is a flowchart of one embodiment of a method for controlling a speed of a fan in a computer using the apparatus of FIG. 1.

FIG. 2 is a flowchart of one embodiment of a method for controlling a speed of a fan in a computer using the apparatus 10 of FIG. 1. The method can automatically control the speed of the fan 2 using the apparatus 10, to decrease noise and save electric power. Depending on the embodiment, additional blocks may be added, others removed, and the ordering of the blocks may be changed.

In block S201, the IBMC 11 is powered on when the computer boots up, and detects a voltage status of the GIPO pin 110. In one embodiment, the GIPO pin 110 is has a default value that is defined as a low voltage status (e.g., 0 volts is denoted as a digital number "0") when the IBMC 11 does not operate normally. The voltage status of the GIPO pin 110 is changed from the low voltage status to a high voltage status (e.g., 5 volts is denoted as a digital number "1") when the IBMC 11 operates normally.

In block S202, the IBMC 11 generates an enabling signal to enable the signal generator 12 according to a low voltage status of the GPIO pin 110, and controls the signal switch 14 to switch to the signal buffer 13 according to the enabling signal.

In block S203, the signal generator 12 generates a first PWM signal according to a system temperature of the computer, and sends the first PWM signal to the signal switch 14 through the signal buffer 13. In one embodiment, the system temperature may include the temperature of a CPU, a memory, a hard disk drive, CD-ROM drive or other components of the computer.

In block S204, the signal switch 14 controls the speed of the fan 2 according to the first PWM signal. In block S205, the IBMC 11 determines whether the IBMC 11 operates normally according to the voltage status the GIPO pin 110. If the IBMC 11 does not operate normally, block S202 is repeated. Otherwise, if the IBMC 11 operates normally, block S206 is repeated.

In block S206, the IBMC 11 generates an disabling signal to disable the signal generator 12 according to the high voltage status of the GPIO pin 110, and controls the signal switch 14 to switch to the IBMC 11 according to the disabling signal.

In block S207, the IBMC 11 generates the second PWM signal according to the system temperature of the computer, and sends the second PWM signal to the signal switch 14 through the signal output port 112. In block S208, the signal switch 14 controls the speed of the fan 2 according to the second PWM signal.

Although certain disclosed embodiments of the present disclosure have been specifically described, the present disclosure is not to be construed as being limited thereto. Various changes or modifications may be made to the present disclosure without departing from the scope and spirit of the present disclosure.

What is claimed is:

1. An apparatus for controlling a speed of a fan in a computer, the apparatus comprising:
    a signal generator, a signal buffer, a signal switch, and an integrated baseboard management controller (IBMC) comprising a general purpose input output (GIPO) pin and a signal output port;
    the IBMC configured to determine whether the IBMC operates normally by detecting a voltage status of the GIPO pin, generate an enabling signal to enable the signal generator and switch the signal switch to the signal buffer according to the enabling signal when the IBMC does not operate normally, and generate an disabling signal to disable the signal generator, and switch the signal switch to the IBMC according to the disabling signal when the IBMC operates normally;
    the signal generator configured to generate a first pulse width modulation (PWM) signal according to a system temperature of the computer, and send the first PWM signal to the signal switch through the signal buffer;
    the IBMC further configured to generate a second PWM signal according to the system temperature of the computer, and send the second PWM signal to the signal switch through the signal output port; and
    the signal switch configured to control the speed of the fan according to the first PWM signal when the IBMC does not operate normally, and control the speed of the fan according to the second PWM signal when the IBMC operates normally.

2. The apparatus according to claim 1, wherein the signal buffer is a signal amplifier that is used to amplify the first PWM signal and send the amplified PWM signal to the signal switch.

3. The apparatus according to claim 1, wherein the enabling signal is generated when the voltage status of the GPIO pin is a low voltage status, and the disabling signal is generated when the voltage status of the GPIO pin is a high voltage status.

4. The apparatus according to claim 1, wherein the first PWM signal is a pulse signal for decreasing a duty ratio of the speed of the fan.

5. The apparatus according to claim 1, wherein the second PWM signal is a pulse signal for increasing a duty ratio of the speed of the fan.

6. The apparatus according to claim 1, wherein the system temperature comprises a temperature of a CPU, a memory, a hard disk drive, and a CD-ROM drive.

7. A method for controlling a speed of a fan in a computer, the method comprising:
    determining whether an integrated baseboard management controller (IBMC) of the computer operates normally by detecting a voltage status of a general purpose input output (GIPO) pin of the IBMC;
    if the IBMC does not operates normally, executing block (a1) to block (a5):
    (a1) generating an enabling signal to enable a signal generator by the IBMC;
    (a2) switching a signal switch to a signal buffer according to the enabling signal;
    (a3) generating a first pulse width modulation (PWM) signal by the signal generator according to a system temperature of the computer;
    (a4) sending the first PWM signal to the signal switch through the signal buffer;
    (a5) controlling the speed of the fan by the signal switch according to the first PWM signal;
    if the IBMC operates normally, executing block (b1) to block (b5):
    (b1) generating an disabling signal to disable the signal generator using the IBMC;
    (b2) switching the signal switch to the IBMC according to the disabling signal;
    (b3) generating a second PWM signal by the IBMC according to the system temperature of the computer;
    (b4) sending the second PWM signal to the signal switch through a signal output port of the IBMC;
    (b5) controlling the speed of the fan by the signal switch according to the second PWM signal.

8. The method according to claim 7, wherein the signal buffer is a signal amplifier that is used to amplify the first PWM signal and send the amplified first PWM signal to the signal switch.

9. The method according to claim 7, wherein the enabling signal is generated when the voltage status of the GPIO pin is a low voltage status, and the disabling signal is generated when the voltage status of the GPIO pin is a high voltage status.

10. The method according to claim 7, wherein the first PWM signal is a pulse signal for decreasing a duty ratio of the speed of the fan.

11. The method according to claim 7, wherein the second PWM signal is a pulse signal for increasing a duty ratio of the speed of the fan.

12. The method according to claim 7, wherein the system temperature comprises a temperature of a CPU, a memory, a hard disk drive, and a CD-ROM drive.

* * * * *